(12) United States Patent
Chau et al.

(10) Patent No.: US 7,960,097 B2
(45) Date of Patent: Jun. 14, 2011

(54) METHODS OF MINIMIZING ETCH UNDERCUT AND PROVIDING CLEAN METAL LIFTOFF

(75) Inventors: Frank Hin Fai Chau, Fremont, CA (US); Yan Chen, Fremont, CA (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 619 days.

(21) Appl. No.: 11/929,795

(22) Filed: Oct. 30, 2007

(65) Prior Publication Data
US 2009/0111061 A1    Apr. 30, 2009

(51) Int. Cl.
*G03F 7/26* (2006.01)
(52) U.S. Cl. ......... 430/314; 430/313; 430/311; 430/329
(58) Field of Classification Search .................. 430/311, 430/313, 324, 315, 394
See application file for complete search history.

(56) References Cited

U.S. PATENT DOCUMENTS

| | | | |
|---|---|---|---|
| 4,202,914 A * | 5/1980 | Havas et al. | 204/192.32 |
| 4,212,935 A | 7/1980 | Canavello et al. | |
| 4,770,739 A * | 9/1988 | Orvek et al. | 438/717 |
| 4,775,609 A | 10/1988 | McFarland | |
| 5,017,459 A * | 5/1991 | McColgin | 430/299 |
| 5,318,877 A | 6/1994 | Ober et al. | |
| 5,360,698 A | 11/1994 | Hanrahan | |
| 5,665,251 A | 9/1997 | Robertson et al. | |
| 5,804,487 A * | 9/1998 | Lammert | 438/319 |
| 6,218,056 B1 | 4/2001 | Pinarbasi et al. | |
| 6,495,311 B1 | 12/2002 | Khan et al. | |

OTHER PUBLICATIONS

Horng, CT; IBM TDB 08-83 p. 1729; "Photoresist Structure for Lifting Off Sputterned Metal Films", Aug. 1, 1983.*
Lin, B. J., "Multi-Layer Resist Systems as a Means to Submicron Optical Lithography," IBM Thomas J. Watson Research Center, Yorktown Heights, New York 10598, CH1832-5/82/0000-0391 1982 IEEE, IEDM 82 pp. 391-395.

(Continued)

*Primary Examiner* — Kathleen Duda
*Assistant Examiner* — Caleen O Sullivan
(74) *Attorney, Agent, or Firm* — Schwabe Williamson & Wyatt

(57) ABSTRACT

A method of minimizing etch undercut and providing clean metal liftoff in subsequent metal deposition is provided. In one embodiment a bilayer resist mask is employed and used for etching of underlying substrate material and subsequent metal liftoff. In one embodiment, the top layer resist such as positive photoresist which is sensitive to selected range of energy, such as near UV or violet light, is first patterned by standard photolithography techniques and resist development in a first developer to expose portion of a bottom resist layer which is sensitive to a different selected range of energy, such as deep UV light. The exposed portion of the bottom layer resist is then removed by anisotropic etching such as oxygen reactive ion etching using the top layer resist as the etch mask to expose portion of the underlying substrate. This minimizes the undercut in the bottom resist around the top photoresist opening. The resultant patterned bilayer resist stack is then used as the etch mask for the subsequent etching of the exposed portion of the underlying substrate material. Because there is no undercut in the bottom resist layer, the etch undercut in the substrate material is also minimized relative to the edges of the top photoresist opening.

28 Claims, 15 Drawing Sheets

OTHER PUBLICATIONS

Kaul, Anupama B., et al., "Fabrication of wide-IF 200-300 GHZ superconductor-insulator-superconductor mixers suspended metal beam leads formed on silicon-on-insulator," J. Vac. Sci. Technol. B 22(5), Sep./Oct. 2004 American Vacuum Society pp. 2417-2422.

Klauk, Hagen, et al., "Fast Organic Thin-Film Transistor Circuits," IEEE Electron Device Letters, vol. 20, No. 6, Jun. 1999 pp. 289-291.

Article titled, "Micro-Chem—NANO PMGI Resists" published by MicroChem Corp., 2002; pp. 1-6.

* cited by examiner

US 7,960,097 B2

METHODS OF MINIMIZING ETCH UNDERCUT AND PROVIDING CLEAN METAL LIFTOFF

FIELD OF THE INVENTION

The present invention relates generally to methods of etching substrates. More particularly the present invention relates to the formation and processing of bilayer resist layers used in substrate etching, subsequent metal deposition in the same bilayer resist opening and improved metal liftoff.

BACKGROUND OF THE INVENTION

Methods for etching of substrates are widely used in the fabrication of semiconductors and electronic components. Generally, etching processes are used in the fabrication of building metal layers and structures on the substrates. There are two general approaches to create patterned metal on a substrate. The "subtractive" or "etch-back" approach is to first deposit metal over the entire substrate surface followed by subsequent patterning of a resist etch mask on top of the metal and then selectively removing the metal in unwanted areas by wet or dry etching. The "additive" or "liftoff" approach is to do metal liftoff in which resist is first patterned on the substrate surface followed by subsequent deposition of metal by sputter deposition or evaporation method. The sacrificial resist layer is then dissolved in a suitable solvent, lifting off the metal on top of the resist and leaving only metal in the resist opening areas on the substrate. The "liftoff" technique allows easy creation of metal patterns comprising different metal layers whereas selective removal of all the metal layers in the "etch-back" approach is not always easy and straightforward.

To facilitate metal deposition and subsequent clean metal liftoff, an overhang resist edge profile is often needed to prevent metal from being deposited on sidewalls of the resist and connected to the metal deposited on the substrate in patterned areas, and to allow for the solvent to reach and dissolve the sacrificial resist layer. This can be accomplished by several conventional techniques.

The simplest technique is to coat and then expose a single photoresist layer on a substrate through an imaging mask. A positive photoresist is one in which the exposed region will get dissolved in a developer whereas a negative photoresist works the opposite way. Owing to the gradual decrease of light intensity through absorption in photoresist during image exposure, the portion of resist closest to the surface sees the highest intensity of light and the bottom part has least. Upon resist development, positive photoresist naturally gives a positive slope of resist profile along edge of the opening and negative photoresist gives a negative slope instead. The negative slope in the negative resist edge profile provides the necessary resist overhang for clean metal liftoff. However, a drawback of negative photoresists is the swelling of resist around the development pattern, which makes the dimension control difficult.

In one prior art technique represented schematically in FIG 1a, a single layer of positive photoresist 110 is used on top of an underlying substrate material 100 and as generally shown in J. M. Shaw et al., "Negative photoresists for optical lithography", IBM Journal of Research and Development, vol. 41, nos. 1/2, 1997, FIG. 3a. Upon an image exposure and resist development in a suitable developer, a resist opening with a positive slope of resist edge profile is created. The resist opening exposes portion 102 of the underlying substrate. An isotropic dry or wet etch is then used to remove the exposed portion 102 of the underlying substrate material 100 in the resist opening to an etched surface 112 of a desired etch depth using the patterned positive photoresist 110 as the etch mask. This is illustrated in FIG 1b. The isotropic etching creates etch undercuts 114 and 116 around the photoresist opening. For this approach of using a single layer of positive photoresist 110 and relying on the etch undercuts 114 and 116 to do a subsequent metal liftoff to work, the total thickness of the deposited metal 120 shown in FIG. 1c has to be smaller than the etch depth or otherwise the metal 120 deposited on the etched substrate surface 112 in the photoresist opening would be connected to the same metal 120 deposited on the sidewalls of the photoresist opening and therefore lead to shorted metals and difficulties in subsequent metal liftoff. This limits the total thickness of the metal that can be deposited on the etched surface. The metal liftoff is achieved by dissolving the photoresist layer 110 in a suitable solvent such as acetone, thereby lifting off the deposited metal 120 on top of the patterned photoresist 110 and leaving only the deposited metal 120 on top of the etched surface 112 of the underlying material 100. The finished structure is shown in FIG 1d.

In another prior art technique shown in FIG. 2a, the process makes use of a single layer of negative photoresist 210 on top of an underlying substrate material 200. Upon an image exposure and resist development in a suitable developer, a resist opening with a natural negative slope of resist edge profile is created. The resist opening exposes portion 202 of the underlying substrate. Owing to the negative slope of the resist edge profile, resist undercuts 204 and 206 are naturally present and facilitate subsequent metal liftoff. An isotropic or anisotropic dry or wet etch is then used to remove the exposed portion 202 of the underlying substrate material 200 in the resist opening to an etched surface 212 of a desired etch depth using the patterned negative photoresist 210 as the etch mask. This is illustrated in FIG. 2b. The etching may create additional etch undercuts 214 and 216 around the photoresist opening. As shown in FIG. 2c, the total deposited metal thickness is to be no greater than the combined thickness of the negative photoresist 210 and the etch depth of the underlying material 200 for clean metal liftoff. Unlike the prior art shown in FIGS. 1a to 1d, this method allows the deposited metal 220 to be thicker than the etch depth of the underlying substrate material 200 and still gives clean metal liftoff. The metal liftoff is accomplished by dissolving the photoresist layer 210 in a suitable solvent such as acetone, thereby lifting off the deposited metal 220 on top of the patterned photoresist 210 and leaving only the deposited metal 220 on top of the etched surface 212 of the underlying material 200. The laterally etched regions 222 and 224 in the finished structure shown in FIG. 2d are generally wider than the corresponding regions 122 and 124 in FIG. 1d in the prior art that used a single layer of positive photoresist 110 for the same etch depth and the same photoresist adhesion to the same underlying material 100 and 200. It is a disadvantage of this approach that makes use of a resist edge profile with such a negative slope around the photoresist opening in etching prior to metal deposition if one of the requirements is to minimize the laterally etched regions 222 and 224 around the deposited metal 220 on the etched substrate surface 212.

U.S. Pat. No. 4,212,935, describes another prior art technique wherein a single positive photoresist layer is also used but a chemical (e.g. chlorobenzene, fluorobenzene, bromobenzene, xylene or toluene) treatment is done either before or after the pattern exposure of the photoresist layer and either before or after a photoresist bake. This retards the developer attack in the surface region of the photoresist layer affected by the chemical modification. The resultant photoresist 310 has an undercut or overhang edge profile around the photoresist pattern opening as illustrated in FIG. 3a. The resist undercuts 304 and 306 under the photoresist overhangs 307 and 308 facilitate subsequent metal liftoff. An isotropic or anisotropic dry or wet etch is then used to remove the exposed portion 302 of the underlying substrate material 300 in the resist opening to an etched surface 312 of a desired etch depth using the patterned positive photoresist 310 as the etch mask. This is illustrated in FIG. 3b. The etching may create additional etch undercuts 314 and 316 around the photoresist opening. As shown in FIG. 3c, the total deposited metal thickness is to be no greater than the combined thickness of the photoresist under the resist overhangs and the etch depth of the underlying material 300 for clean metal liftoff. Also unlike the prior art shown in FIGS. 1a to 1d, this method allows the deposited metal 320 to be thicker than the etch depth of the underlying substrate material 300 and still gives clean metal liftoff. The metal liftoff is accomplished by dissolving the photoresist layer 310 in a suitable solvent such as acetone, thereby lifting off the deposited metal 320 on top of the patterned photoresist 310 and leaving only the deposited metal 320 on top of the etched surface 312 of the underlying material 300. The laterally etched regions 322 and 324 in the finished structure shown in FIG. 3d are also generally wider than the corresponding regions 122 and 124 in FIG. 1d in the prior art that used a single layer of positive photoresist 110 for the same etch depth and the same photoresist adhesion to the same underlying material 100 and 300. It is a disadvantage of this approach that makes use of a photoresist edge profile with such an overhang around the photoresist opening in etching prior to metal deposition if one of the requirements is to minimize the laterally etched regions 322 and 324 around the deposited metal 320 on the etched substrate surface 312.

Further developments in the prior art have focused on an image reversal photoresist process to produce a re-entrant resist edge profile needed for clean metal liftoff. There are two ways to create the image reversal effect shown in the prior art. In a first method such as that generally described in U.S. Pat. No. 4,775,609 and in IBM Journal of Research and Development, vol. 41, nos. 1/2, 1997, FIG. 4b, and represented schematically herein in FIG. 4a, a single layer of positive photoresist 410 is first selectively exposed with near UV or violet irradiation through an imaging mask. It is then treated with a gaseous base such as ammonia. The wafer is subsequently exposed to vacuum to remove the excess base. It is then followed by a blanket exposure without a mask to near UV or violet light. A high temperature bake (known as a "reversal" bake) is next performed before the photoresist is finally developed in a suitable aqueous alkali developer. Those areas that received the first near UV or violet irradiation through the imaging mask remain and those areas that were blanket exposed but did not receive the first near UV or violet irradiation are removed by the developer, thereby resulting in the inverse of the original mask pattern. Alternatively, a single layer of an image reversal photoresist such as the AZ 5200E series resists manufactured by AZ Electronic Materials USA Corporation can also be used to achieve the same image reversal effect without the need for a gaseous ammonia treatment and vacuum. The image reversal photoresist film 410 is first selectively exposed with near UV or violet irradiation through an imaging mask and then goes through a "reversal" bake, which makes the exposed image areas less soluble in basic developers than the unexposed image regions. The resist film is then blanket exposed without a mask with near UV or violet irradiation to expose both the previously exposed and unexposed areas. Upon the removal of the unexposed image areas in a suitable developer, a negative image of the original mask with a re-entrant resist edge profile is formed as shown in FIG. 4a. In either method, the slope of the photoresist sidewalls can be tailored from positive to negative by carefully controlling the reversal bake temperature, the bake time and the resist development time. The re-entrant resist edge profile having undercuts 404 and 406 forms the resist overhang structure needed for subsequent metal liftoff. In this approach, an isotropic or anisotropic dry or wet etch can be used to subsequently remove the exposed portion 402 of the underlying material 400 in the resist opening to an etched surface 412 of a desired etch depth using the patterned positive resist 410 as the etch mask. This is illustrated in FIG. 4b. The etching may create additional etch undercuts 414 and 416 around the photoresist opening. As shown in FIG. 4c, the total deposited metal thickness is to be no greater than the combined thickness of the resist under the resist overhangs and the etch depth of the underlying material 400 for clean metal liftoff. Also unlike the prior art shown in FIGS. 1a to 1d, this method allows the deposited metal 420 to be thicker than the etch depth of the underlying substrate material 400 and still gives clean metal liftoff. The metal liftoff is accomplished by dissolving the photoresist layer 410 in a suitable solvent such as acetone, thereby lifting off the deposited metal 420 on top of the patterned photoresist 410 and leaving only the deposited metal 420 on top of the etched surface 412 of the underlying material 400. The laterally etched regions 422 and 424 in the finished structure shown in FIG. 4d are also generally wider than the corresponding regions 122 and 124 in FIG. 1d in the prior art that used a single layer of positive photoresist 110 for the same etch depth and the same photoresist adhesion to the same underlying material 100 and 400. It is a disadvantage of this approach that makes use of such a re-entrant resist edge profile around the photoresist opening in etching prior to metal deposition if one of the requirements is to minimize the laterally etched regions 422 and 424 around the deposited metal 420 on the etched substrate surface 412. Another known problem in this approach is the difficulty in controlling of the amount of photoresist undercuts 404 and 406 in the re-entrant resist edge profile.

When thick photoresist is needed to provide good resist step coverage on a highly non-planar surface and yet be able to simultaneously give good pattern resolution, or when independent control of resist overhangs or undercuts is needed, a multi-layer resist system can be used. Independent control of the size of the opening in the top resist and the undercuts in the bottom resist can be accomplished with multi-layer resist methods. Many combinations or permutations using two or three layers of different materials have been reported. Some of them are described below.

Typically a bilayer resist process comprises a bottom resist layer that contacts the surface of the substrate and a top resist layer overlying the bottom resist layer. The top resist layer is first lithographically defined. The pattern in the top resist layer is then transferred to the bottom resist layer by etching the bottom resist in plasma such as oxygen reactive ion etching (RIE). These bilayer resist schemes are generally used when both good step coverage and good resolution are needed. The bottom resist layer is typically made relatively thick to first planarize the substrate surface and the top resist layer is made relatively thin to provide the needed resolution for fine features to be patterned in the top resist layer by lithographic means. For these techniques to work, it is important to have the top resist layer being essentially unaffected by plasma etching relative to the bottom resist layer. One example of how to make the top resist layer more resistance to plasma etching relative to the underlying resist layer is given in U.S. Pat. No. 5,318,877. These methods, however, generally do not result in sufficient resist overhangs needed for clean metal liftoff for a thick metal layer and the resultant bilayer resist edge profile is similar to that in the prior art that utilizes a single layer of positive photoresist described earlier and illustrated in FIGS. 1a to 1d. In these cases the total deposited metal thickness is limited to no greater than the etch depth of the underlying substrate material.

To create an overhang resist edge structure, one prior art technique involves a bilayer photoresist process comprising two layers of positive-working photoresist as described in detail in U.S. Pat. No. 5,360,698. Care must be taken to prevent intermixing of the two similar photoresist materials. Typically, after the coating of the bottom photoresist layer, plasma etch or thermal treatment is used to alter the surface characteristics of the bottom resist layer to produce a buffer layer which prevents the intermixing. This process allows the top resist to be coated uniformly and maintains the distinction between the two layers. Two resist materials may be chosen such that they either exhibit different dissolution rates in the same developer or else they use mutually exclusive developers. In this case, an overhang resist structure can be produced. Depending upon the treatment conditions used to form the buffer layer, it may be necessary to use a two step development process with an intermediate etch step to remove the buffer layer.

In another prior art technique as described in U.S. Pat. No. 5,360,698, the overhang resist edge structure uses two separate resist layers, the bottom being deep UV patternable and the top being patternable at an appropriate wavelength other than deep UV and having low optical transmission properties at the wavelength used in a deep UV exposure step and characterized by decreased solubility and/or increased crosslink density after such deep UV exposure. The development of the bottom resist removes some of the bottom resist layer that is under the top resist resulting in an overhang resist edge structure for metal liftoff.

In yet another prior art technique, generally described in U.S. Pat. No. 6,495,311 and schematically represented herein in FIG. 5a, a bilayer resist process consisting of a first, bottom resist layer 510 such as polymethyl-glutarimide (PMGI) (U.S. Pat. No. 6,495,311 B1) or polymethyl-methacrylate (PMMA) (H. Kluak et al., "Fast Organic Thin-Film Transistor Circuits, IEEE Electron Device Letters, vol. 20, no. 6, June 1999, pp. 289) and a second, top photoresist layer 520 is used. Using standard photolithographic techniques, the top layer photoresist is exposed through an imaging mask and developed with a suitable developer. The developer may remove portion of the lower resist layer through the opening in the top photoresist layer. Alternatively, the lower resist layer can be developed separately with a second developer that dissolves only the lower resist layer but not the upper photoresist. An oxygen plasma descum or reactive ion etching step may be necessary to remove the intermixed interfacial layer between the two layers of resist before the bottom resist layer is developed. Using either developing step, the bottom resist layer is developed to expose portion 502 of the underlying substrate 500 through the opening in the top photoresist layer. Undercuts 504 and 506 in the bottom resist layer are formed during the development of the bottom resist layer. Subsequent steps illustrated in FIGS. 5b to 5d for utilizing the resultant bilayer overhang resist structure for etching the exposed portion 502 of the underlying material 500 and subsequently lifting off the deposited metal 530 on top of the top photoresist layer 520 are similar to those in other prior art described previously in FIGS. 2b to 2d, 3b to 3d and 4b to 4d. As shown in FIG. 5c, the total deposited metal thickness is to be no greater than the combined thickness of the bottom resist layer 510 and the etch depth of the underlying material 500 for clean metal liftoff. Upon metal liftoff in a suitable solvent such as acetone, only the deposited metal 530 is left on top of the etched surface 512 of the underlying material 500. The laterally etched regions 522 and 524 in the finished structure shown in FIG. 5d are also generally wider than the corresponding regions 122 and 124 in FIG. 1d in the prior art that used a single layer of positive photoresist 110 for the same etch depth and the same photoresist adhesion to the same underlying material 100 and 500. It is a disadvantage of this approach that makes use of a bilayer resist process with such an overhang resist edge profile in etching prior to metal deposition if one of the requirements is to minimize the laterally etched regions 522 and 524 around the deposited metal 530 on the etched substrate surface 512.

Bilayer resists are less cumbersome than trilayer resists. But if they do not work out for a specific application, trilayer methods may be considered. A typical one of the multi-layer methods is a three-layer method which provides upper and lower resist layers and an intermediate layer disposed between them. A pattern is transferred from the upper layer to the intermediate layer and from the intermediate layer to the lower layer with the use of a RIE process. The intermediate layer prevents the upper and lower resist layers from interacting with each other and provides etch resistance when the lower layer is subjected to the RIE process. To achieve this function, the intermediate layer is usually made of spin on glass (SOG, i.e. organic silicon glass) or metal as in U.S. Pat. No. 5,665,251. This method allows for the formation of an overhang resist edge profile needed for clean metal liftoff.

There are other methods of making bilayer liftoff masks involving, for example, electron beam lithography such as described in U.S. Pat. No. 6,218,056 B1. However, such techniques require the use of a separate, expensive electron beam lithography tool and lose the advantage of doing all mask patterning steps all optically with a conventional photolithography tool such as a stepper or a mask aligner.

The conventional techniques and prior art described above provide good ways to form the necessary overhang or re-entrant resist edge profile in an opening for metal liftoff. However, such methods have limitations. With the exception of the prior art that uses a single layer of positive photoresist, as illustrated in FIGS. 1a to 1d, and a bilayer resist process wherein the bottom resist is patterned by anisotropic etching in oxygen RIE using the top resist layer as the etch mask and in either case no resist overhang is present, all other aforementioned prior art involve the first creation of a resist overhang structure before a subsequent etching of the underlying material is made. Without a resist overhang for clean metal liftoff, the total thickness of the deposited metal is limited to no greater than the etch depth of the underlying substrate. When resist overhangs or undercuts are present, however, the subsequent etch undercuts of the underlying substrate around the deposited metal pattern on the etched substrate surface are naturally large compared to ones with straight resist sidewalls. Accordingly, further improvements are needed. Particularly, improved methods are needed that address the limitations of the prior art techniques while providing sufficient step coverage on a highly non-planar substrate surface and allowing for the total deposited metal thickness to be greater than the etch depth of the underlying substrate. Improvements are also needed that provide for scaling the etch undercut regions.

SUMMARY OF THE INVENTION

The present invention relates generally to methods of etching substrates. More particularly the present invention relates to the formation and processing of bilayer resist layers used in substrate etching, subsequent metal deposition in the same bilayer resist opening and metal liftoff. Additionally, the present invention relates to methods for minimizing substrate etch undercut while providing clean metal liftoff with a bilayer resist process.

In order to overcome the aforementioned problems and limitations of the prior art of large etch undercuts associated with an overhang resist edge profile for substrate etching and lifting off of deposited metal, the inventors have discovered and developed a bilayer resist structure comprising a relatively thick layer of top photoresist sensitive to a selected range of energy, such as for example without limitation near UV or violet light, and a relatively thin layer of bottom resist sensitive to a different selected range of energy, such as for example without limitation deep UV light. In one embodiment the bottom resist layer is comprised of polymethylmethacrylate (PMMA). For purposes of describing the present invention, the following definitions are provided for clarity and without limitation. "Violet light" means light having a wavelength in the range of approximately 395 to 490 nanometers. "Near UV light" means light having a wavelength in the range of approximately 310 to 395 nanometers. "Deep UV light" means light having a wavelength of below approximately 310 nanometers.

In one aspect, embodiments of the present invention provide methods of etching a substrate to form one or more metallization features on the substrate, comprising the steps of: forming a bottom layer of resist on the substrate, said bottom layer of resist being sensitive to energy in a first selected range of energy; forming a top layer of resist on said bottom layer, said top layer of resist being of a thickness greater than said bottom layer and being sensitive to energy in a second selected range of energy; exposing a selected portion of the top layer of resist to the second selected range of energy and removing the exposed portion in the top layer to expose a portion of the bottom layer; removing the exposed portion of the bottom layer of resist by exposure to the first selected range of energy to expose a portion of the substrate, wherein the opening in the top layer of resist acts as a mask during exposure of the substrate; etching the exposed portion of the substrate to a desired depth; subsequently forming resist undercuts in said bottom layer of resist; and depositing metal on the exposed portion of the substrate and top layer of resist; and removing the top and bottom layers of resist and lifting off the metal formed on the top layer of resist to form one or more metallization features on the substrate.

In another aspect, embodiments of the present invention provides methods of fabricating one or more metallization features on a substrate, characterized in that: a bilayer resist structure is formed on the substrate and an overhang resist edge profile is formed in a bottom layer of the bilayer resist structure after etching of the substrate to a desired etch depth, said overhang resist edge profile in the bottom layer assisting in lift off of the bilayer resist structure following formation of the one or more metallization features on the substrate.

In some embodiments, a top photoresist is first selectively exposed through an imaging mask with near UV or violet irradiation using standard photolithographic techniques and developed in a first developer which does not dissolve the bottom resist. The exposed portion of the bottom resist in the top photoresist opening is then anisotropically etched in plasma such as oxygen RIE using the patterned top photoresist layer as the etch mask. This exposes a portion of the underlying substrate material in the top photoresist opening. No bilayer resist overhang is present at this stage. The patterned bilayer resist structure is then used as the etch mask for etching the exposed portion of the underlying substrate material to a desired etch depth. Owing to the absence of an overhang in the resist edge profile when this etching is performed, the etch undercut of the underlying material around the etched pattern is minimized. The present invention involves the creation of an overhang resist edge profile only after the etching of the underlying material is complete and it is accomplished through subsequently exposing and developing sidewalls of the bottom resist opening in a second developer. The exposure of the sidewalls of the bottom resist opening is achieved by a suitable means, for example without limitation blanket exposing the entire wafer without a mask with deep UV irradiation. In the case when PMMA is used as the bottom resist, the exposure of the PMMA is accomplished with the light emission from the earlier oxygen plasma used in the removal of the exposed portion of the PMMA resist in the top photoresist opening. Additional blanket exposure of the PMMA to deep UV light can optionally be done to ensure complete exposure of the PMMA sidewall resist. An overhang resist edge profile is next formed by developing the bottom resist in a second developer, which does not develop the exposed top photoresist. The amount of bottom resist undercut is determined by the bottom resist development time in the second developer. If PMMA is used as the bottom resist, one such second developer that develops the deep-UV-exposed PMMA but not the top photoresist is toluene. In another example, chlorobenzene may be used as the second developer.

There are many possible materials and combinations of materials that may be used as photoresist materials in methods of the present invention. For example, another possible material for the bottom resist layer includes PMGI. Exposed PMGI in deep UV light can be developed in PMGI 101 developer, which will not further develop the top imaging resist layer (see Reference: MicroChem NANO PMGI Resists.pdf). Many positive or negative photoresist materials are suitable for the top resist layer including, but not limited to, Shipley Company's 1300 series, S1400 series, 1500 series, S1800 series, SC1800 series, SPR series, SJR series, and UITRA-i series photoresists; and Clariant Corporation's AZ 1300 series, AZ 1500 series, AZ 1900 series, AZ P4000 series, AZ 5200 series, AZ 6200 series, AZ 7200 series, AZ 7700 series, AZ 7900 series, AZ 9200 series, AZ EL2015 series, AZ EPA 914 EZ series, and AZ NOVA 2071 series photoresists; and JSR Micro Inc.'s ArF, KrF, and NFR series photoresists. Since the bottom resist layer now serves only as a release layer to facilitate clean metal liftoff, huge bottom resist undercuts can be made and used without the concern of transferring the resist undercut pattern to the underlying substrate material as long as the top photoresist does not get lifted off during the bottom resist development.

In some embodiments the present invention provides methods of minimizing etch undercuts and providing clean metal liftoff following a subsequent metal deposition after the etching of the exposed portion of the underlying substrate material.

Of one advantage, the present invention avoids any effect associated with the layer intermixing between the bottom and top resist layers. The use of plasma etching such as oxygen RIE in the present invention to remove the exposed portion of the bottom resist using the top photoresist as the etch mask also etches away any intermixed interfacial layer between the two resist layers.

Further, in some embodiments, the present invention provides adequate step coverage on highly non-planar substrate surfaces by using a relatively thin bottom and a relatively thick top resist layers for substrate etching and metal liftoff.

This is in contrast to prior art techniques in which the bottom resist layer is relatively thick and used primarily as a planarization layer and rely on high etch selectivity of the bottom resist over the top masking material comprising another photoresist, spin on glass or metal in oxygen plasma. The present invention utilizes a relatively thin bottom resist layer for the formation of an overhang resist edge profile following the etching of the exposed portion of the underlying substrate material. Step coverage and planarization are accomplished primarily through the use of a relatively thick top photoresist layer. An advantage of this method is that only a relatively short etch time is needed to completely remove the exposed portion of the bottom resist in the top photoresist opening during etching or exposure, thereby minimizing the erosion of the top photoresist mask.

In another aspect, embodiments of the present invention provide methods of further minimizing the etch undercuts around the deposited metal pattern on the etched substrate surface by first introducing a dielectric layer of good adhesion to the substrate material prior to applying the bilayer resist process described above in the present invention. As described above, in some embodiments the invention comprises a bottom resist directly in contact with the underlying substrate material. The etch undercuts are determined by the adhesion of the bottom resist to the underlying substrate material and the etch depth. Organic resist materials generally do not adhere well to a semiconductor substrate surface, leading to large etch undercuts. In one preferred embodiment of the present invention, an extra layer of dielectric material such as silicon nitride is first deposited using standard deposition methods such as plasma enhanced chemical vapor deposition (PECVD) on top of the substrate material prior to formation of the bottom and top resists. In some embodiments the bottom and top resist layers are formed by spinning and coating techniques known in the art. A patterned bilayer resist stack structure without the resist overhang is next formed similar to the method described above in the present invention and is then used as the etch mask for etching of the exposed portion of the dielectric layer through the bilayer resist opening. This is followed by a blanket exposure without a mask with deep UV irradiation and development of the exposed sidewalls of the bottom resist around the bottom resist opening in a second developer, which does not dissolve the exposed top photoresist to create bottom resist undercuts and an overhang resist edge profile in the bottom resist layer useful for subsequent clean metal liftoff. Etching of the dielectric layer can be performed isotropically or anisotropically by wet or dry etching. The dielectric layer provides good adhesion to the underlying substrate material and thus minimizes the etch undercuts of the underlying substrate material around the deposited metal pattern on the etched substrate surface.

In another aspect of the present invention methods of sealing the etch undercut regions around the deposited metal on the etched substrate surface are provided. Sealing of the etch undercut regions on the substrate protects the regions from being chemically attacked in subsequent wafer processing. In some embodiments sealing is accomplished through the addition of an oxygen plasma etching step such as oxygen RIE or descum following the etching of the exposed portion of the dielectric layer in the bilayer resist opening. The additional oxygen plasma etching widens the top photoresist opening to an extent such that the top photoresist opening is larger than the dielectric opening. When etching of the exposed portion of the underlying substrate is complete, the entire wafer is next blanket exposed without a mask. Blanket exposure may be accomplished by any suitable means, for example without limitation by deep UV irradiation. The sidewalls of the bottom resist in the bottom resist opening are then developed in a developer, which does not dissolve the exposed top photoresist, to create bottom resist undercuts. This is followed by metal deposition by means of metal evaporation or sputter deposition method. Because of the presence of the bottom resist undercuts and the larger size of the top photoresist opening, some of the metal is also deposited on the exposed portion of the dielectric layer around the dielectric opening. When the total thickness of the deposited metal is larger than the combined thickness of the dielectric layer and the etch depth of the underlying substrate, the deposited metal on the etched substrate surface is connected to the deposited metal on top of the dielectric layer around the dielectric opening, thereby sealing the etch undercut regions on the substrate from the outside environment.

Embodiments of the present invention advantageously provides a method for creating a liftoff resist structure for clean metal liftoff with minimized etch undercut regions of etched substrate material in a bilayer resist process involving substrate etching. Moreover embodiments of the present invention advantageously provide methods for allowing large bottom layer resist undercuts to assist metal liftoff in a bilayer resist process involving substrate etching. Further, methods provide improved resist step coverage over a highly non-planar substrate surface for metal liftoff in a bilayer resist process.

In another aspect, embodiments of the present invention advantageously provide methods for sealing the etch undercut regions of etched substrate material with metal in a bilayer resist process involving substrate etching and protecting the regions from chemical attacks in subsequent wafer processing or from the environment.

BRIEF DESCRIPTION OF THE DRAWINGS

Other objects, advantages and features of the present invention will become apparent to those skilled in the art upon reading of the detailed description of the invention provided below and upon reference to the drawings in which.

DETAILED DESCRIPTION OF THE INVENTION

Figure 1A:
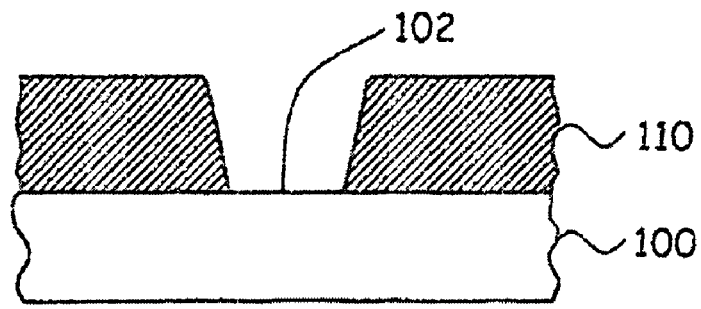
FIGS. 1a-1d are side cross-sectional views in progressive stages of manufacturing illustrating a prior art method using a single layer of positive photoresist.
Figure 1B:
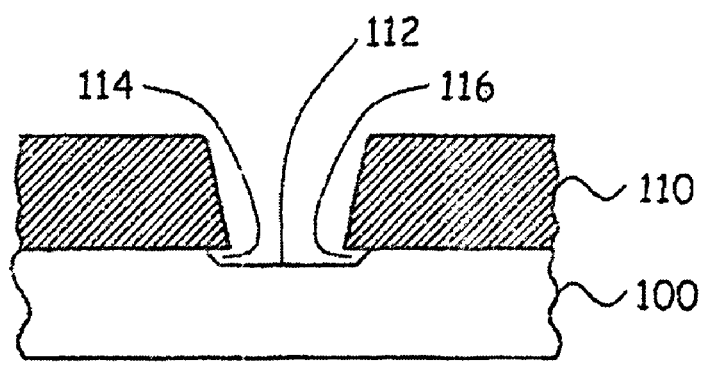
Figure 1C:
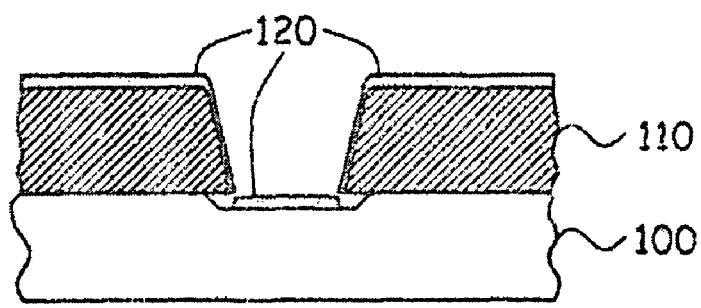
Figure 1D:
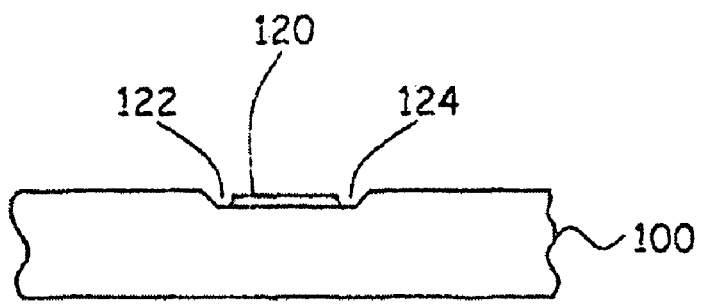
Figure 2A:
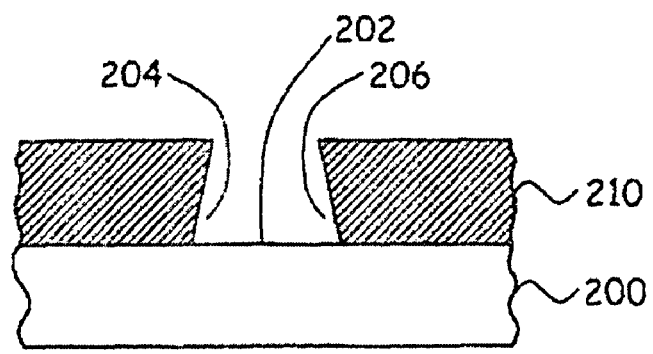
FIGS. 2a-2d are side cross-sectional views in progressive stages of manufacturing illustrating a prior art method using a single layer of negative photoresist.
Figure 2B:
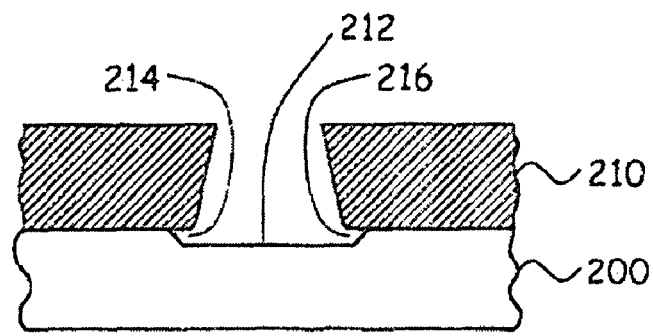
Figure 2C:
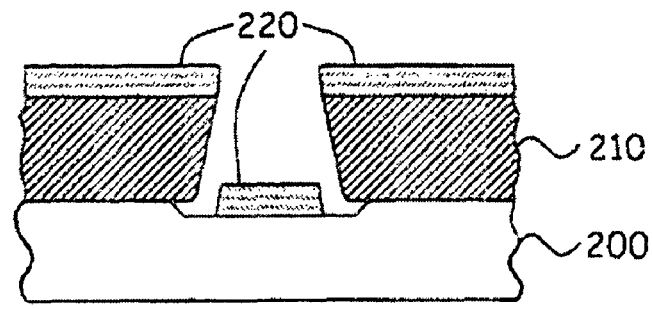
Figure 2D:
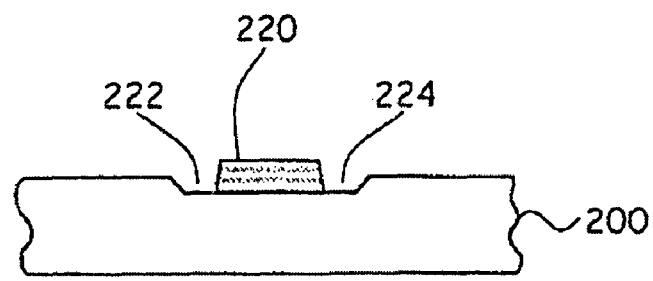
Figure 3A:
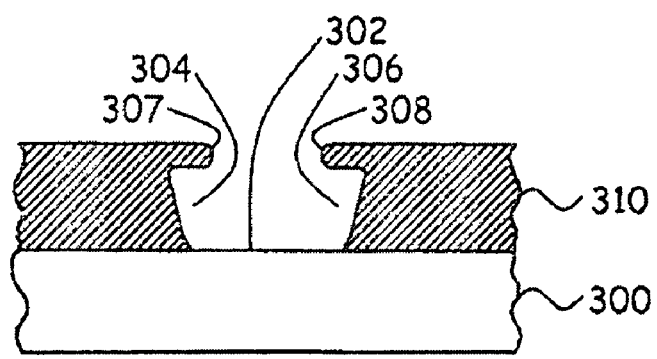
FIGS. 3a-3d are side cross-sectional views in progressive stages of manufacturing depicting a prior art method with a single layer of positive photoresist with a surface treatment.
Figure 3B:
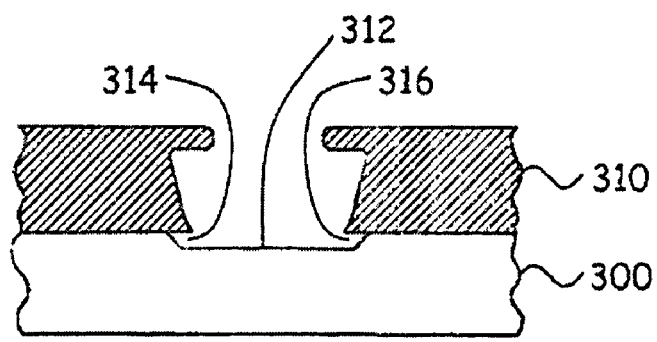
Figure 3C:
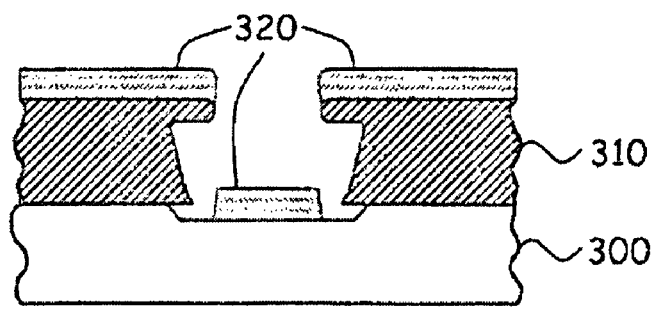
Figure 3D:
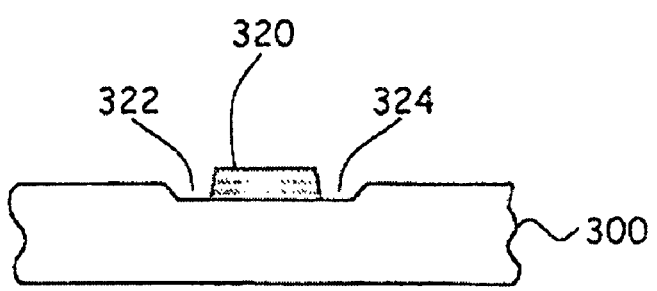
Figure 4A:
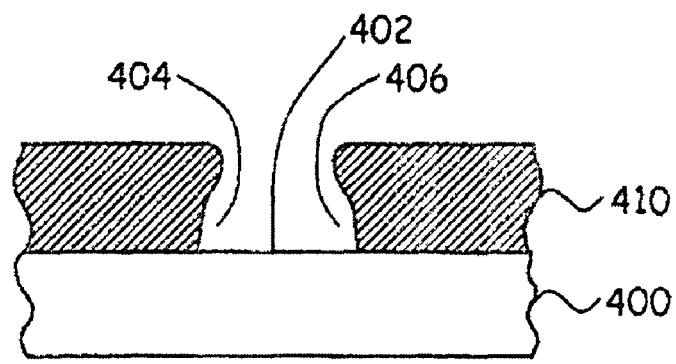
FIGS. 4a-4d are side cross-sectional views in progressive stages of manufacturing illustrating a prior art method with an image reversal process on a single layer of photoresist.
Figure 4B:
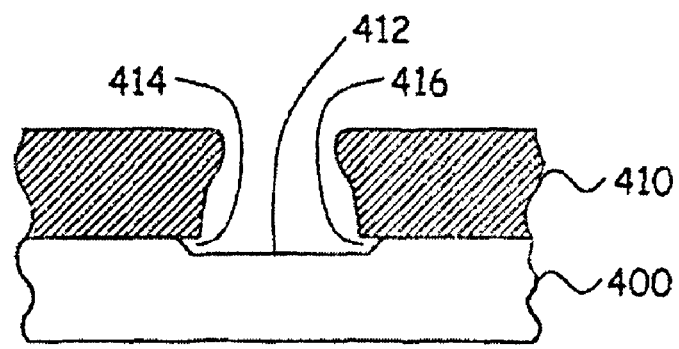
Figure 4C:
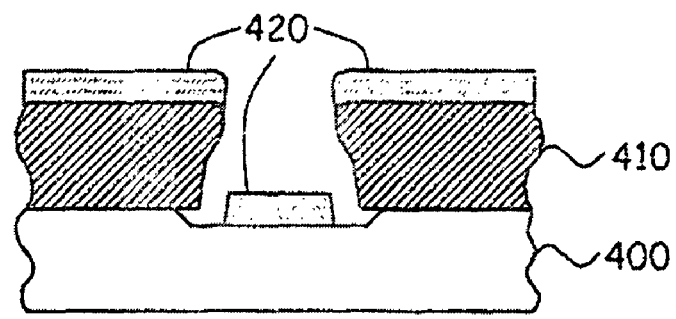
Figure 4D:
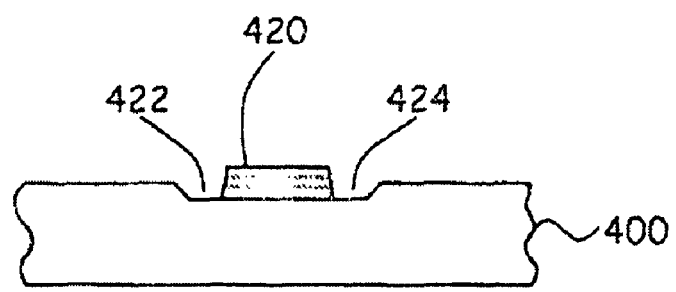
Figure 5A:
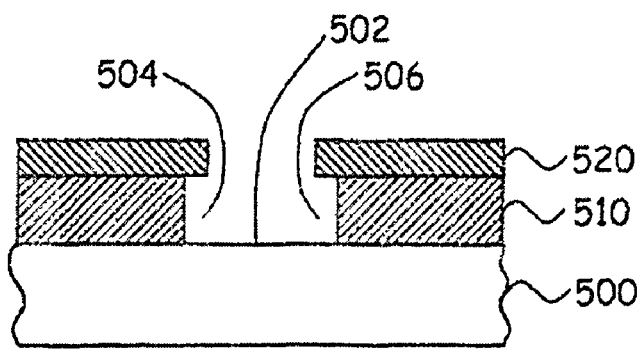
FIGS. 5a-5d are side cross-sectional views in progressive stages of manufacturing showing a prior art method using a bilayer resist process.
Figure 5B:
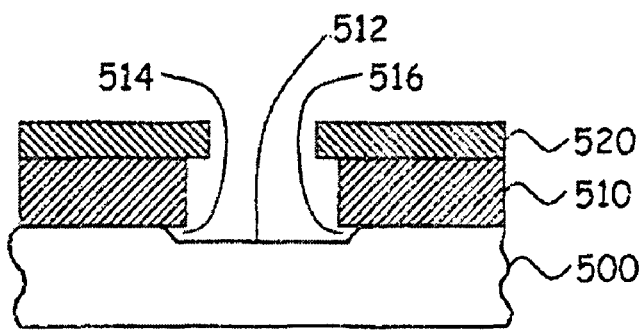
Figure 5C:
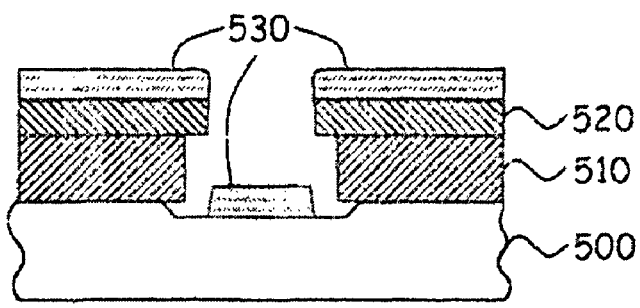
Figure 5D:
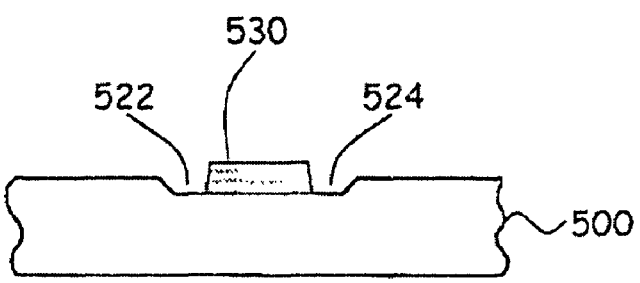
Figure 6A:
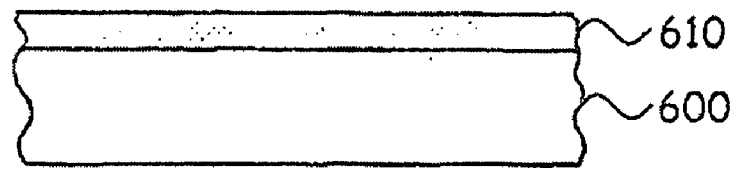
FIGS. 6a-6j are side cross-sectional schematic views illustrating progressive stages of methods of the present invention according to one embodiment.

Referring to FIGS. 6a to 6j, one embodiment of the present invention is illustrated. A relatively thin, bottom layer of resist 610 such as polymethyl-methacrylate (PMMA) is formed on the substrate material 600 (e.g. semiconductor substrate, dielectric, metal, interconnect) as shown in FIG. 6a. In some embodiments bottom layer of resist 610 is spin coated onto the substrate and baked. The bottom resist 610 is comprised of a material that is sensitive to energy in a first selected range. In some embodiments, the first selected range of energy comprises energy having a wavelength of equal to or less than about 310 nanometers. In some embodiments the first selected range of energy is deep UV light.

Figure 6B:
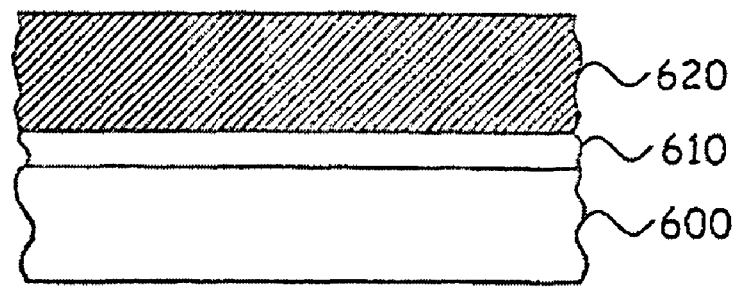
Figure 6C:
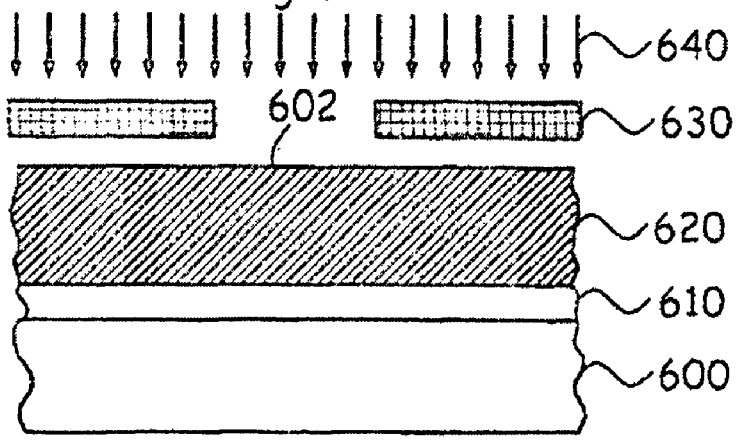
Figure 6D:
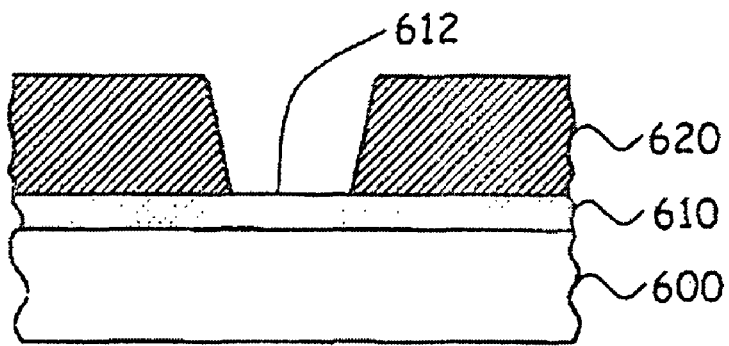
Figure 6E:
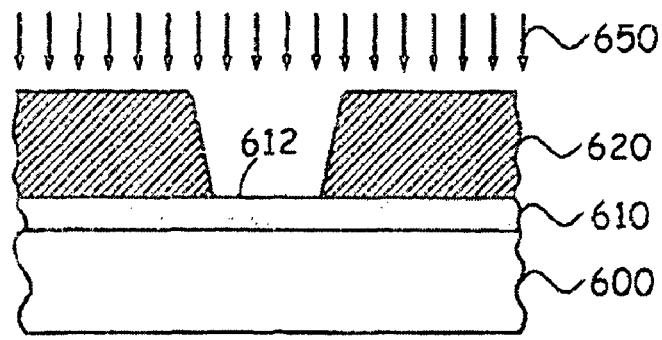
Figure 6F:
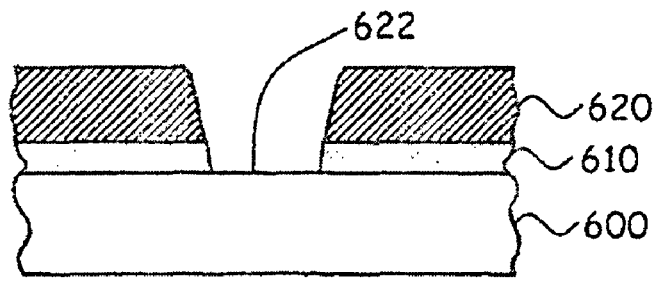
Figure 6G:
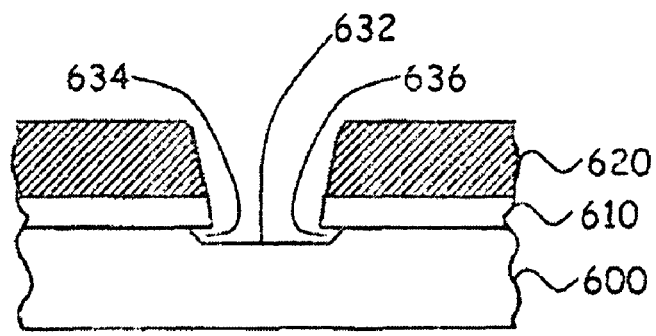

A top layer of photoresist 620 such as AZ 9245 or Shipley SC1827 positive photoresist is subsequently formed on the bottom layer of resist 610 as shown in FIG. 6b. The top layer of resist 620 has a thickness greater than the bottom layer 610. In some embodiments top layer of resist 620 is spin coated onto the bottom layer 610 and baked. The top resist 620 is comprised of a material that is sensitive to energy in a second selected range. In some embodiments, the second selected range of energy comprises energy having a wavelength of greater than about 310 nanometers. In some embodiments the second selected range of energy is comprised of near UV or violet light. In an exemplary embodiment, standard optical lithography tool such as a g-line or i-line stepper or a mask aligner is then used to expose a selected region 602 of the top layer photoresist 620 through an imaging mask 630 with near UV or violet irradiation 640. This is shown in FIG. 6c. A first developer such as Shipley CD-30 is then used to develop the exposed portion 602 of the top layer photoresist 620, thereby exposing portion 612 of the bottom resist layer 610 in the top photoresist opening as shown in FIG. 6d. The bottom resist 610 is insensitive to the near UV or violet light and is unaffected with the first developer. As shown in FIG. 6e, the lithographically defined pattern in the top layer photoresist 620 is then transferred to the bottom resist layer 610 by removing the exposed resist portion 612 using highly anisotropic dry etching in oxygen plasma such as oxygen reactive ion etching (RIE) 650 using the patterned top layer photoresist 620 as the etch mask. This exposes portion 622 of the underlying substrate 600 as illustrated in FIG. 6f. The top layer photoresist 620 is thicker than the bottom layer resist 610 and does not completely erode before the exposed portion 612 of the bottom resist 610 is completely removed. Pattern defined this way in the bottom layer resist retains the steep vertical sidewalls of the top photoresist opening and has 110 bottom resist undercut around the bilayer resist opening as illustrated in FIG. 6f. It is important to have no bottom resist undercut in the resist patterning process so as to minimize the subsequent etch undercuts of the exposed portion of the underlying substrate relative to the edges of the top photoresist opening particularly when an isotropic etching method such as wet etching is used to etch the exposed substrate. The exposed portion 622 of the underlying substrate 600 is then etched using this patterned bilayer resist stack as the etch mask to an etched surface 632 of a desired etch depth, creating etch undercut regions 634 and 636 shown in FIG. 6g.

Figure 6H:
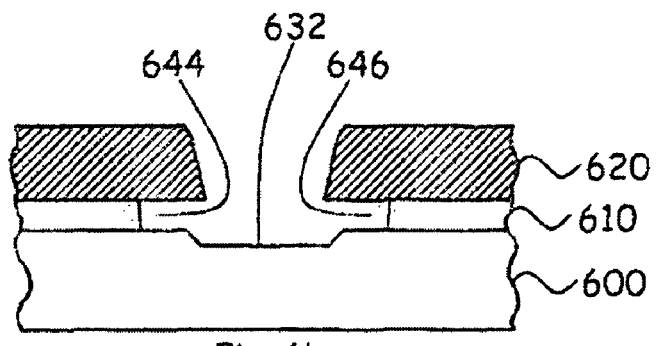
Figure 6I:
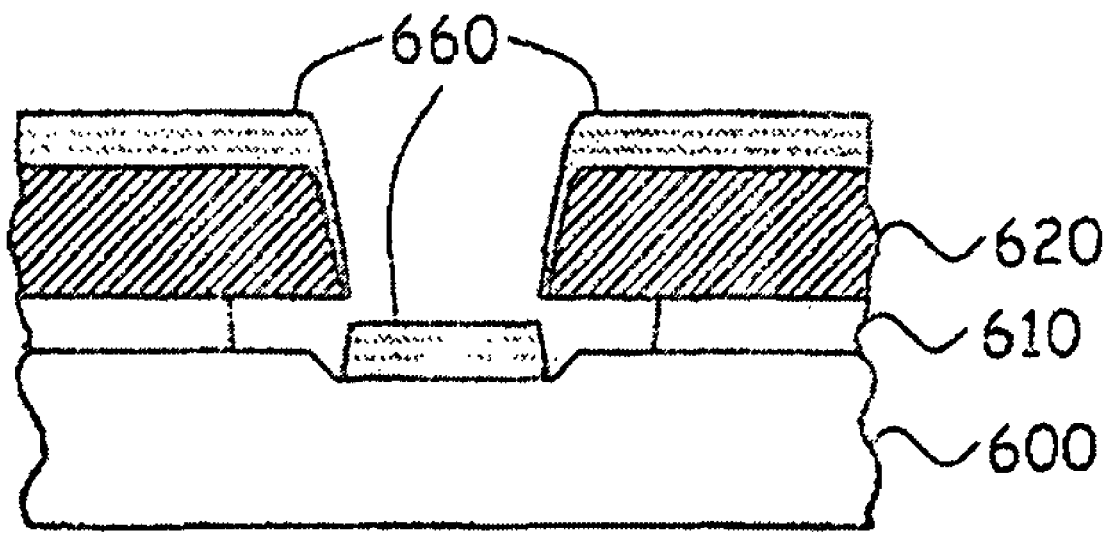
Figure 6J:
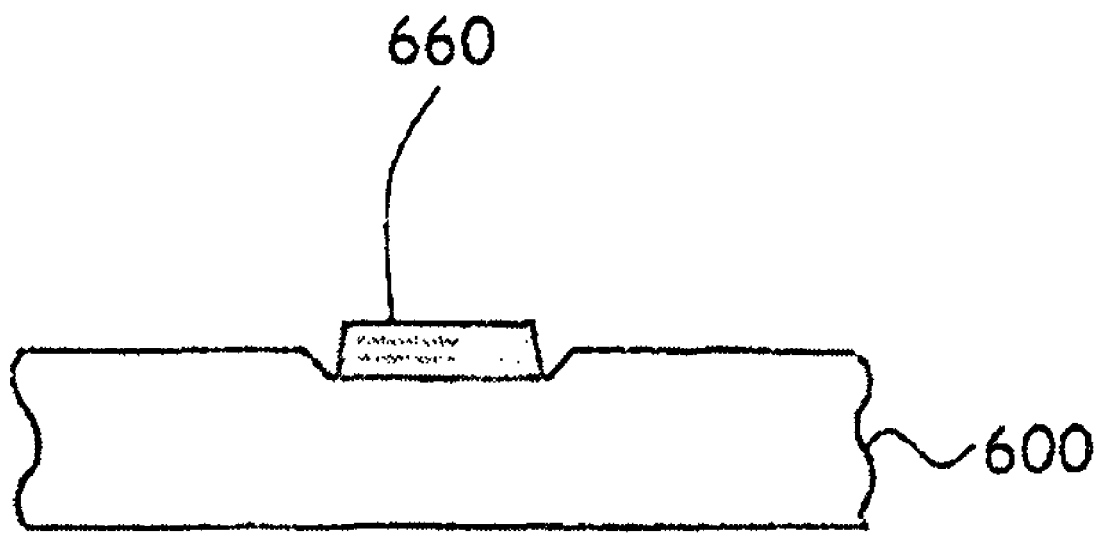

To facilitate clean metal liftoff after the etching of the exposed portion 622 of the underlying material 600, the present invention provides for processing the edge profile of the bilayer resist opening to create resist overhangs in the top layer photoresist opening relative to the edges of the bottom layer resist opening. The procedure is described as follows. After the etching of the exposed portion 622 of the substrate material 600, the entire wafer with the bilayer resist pattern is then blanket exposed without a mask with deep UV irradiation. This exposes the sidewalls of the bottom resist opening to the deep UV light. The sidewalls of the bottom resist opening are next developed in a second developer, which does not dissolve the exposed top layer photoresist 620. If the bottom resist 610 is PMMA and is etched earlier by the means of oxygen RIE, it may not be necessary to use the blanket exposure with deep UV irradiation to expose the sidewalls of the PMMA because the light emission from the oxygen plasma contains light of wavelengths that can expose the PMMA. One such second developer that develops exposed PMMA but not the top photoresist is toluene. A non-limiting example of another suitable second developer is chlorobenzene. The exposure of the sidewalls of the bottom resist opening to deep UV light and the subsequent bottom resist development result in an overhang resist edge profile as shown in FIG. 6h with bottom resist undercuts 644 and 646. The bottom resist undercut amount is determined by the development time in the second developer, and may be selected based on the application. Of particular advantage since the bottom resist layer 610 now serves only as a release layer to facilitate clean metal liftoff, large bottom resist undercuts 644 and 646 can be made and used without the concern of transferring the resist undercut pattern to the underlying substrate 600 as long as the top photoresist 620 does not get lifted off during the bottom resist development. Following the creation of an overhang resist edge profile in the bilayer resist structure, a metal evaporation or sputter deposition step is next performed to deposit the desired metal 660 on the wafer. The total deposited metal thickness is to be no greater than the combined etch depth of the underlying substrate and the thickness of the bottom resist layer 610 for clean metal liftoff so that the deposited metal 660 on the etched substrate surface 632 is not too thick to touch and connect to the deposited metal on the sidewalls of the top photoresist in the opening as illustrated in FIG. 6i. Upon dissolving the two layers of resist in a suitable solvent such as acetone, the deposited metal 660 on top of the top layer photoresist 620 is lifted off, leaving only the deposited metal 660 on top of the etched substrate surface 632. The finished structure is shown in FIG. 6j.

The widths of the etch undercut regions 634 and 636 are determined by the adhesion of the bottom resist 610 to the underlying substrate 600, the etch depth, the etch method such as dry or wet etching, the etch chemistry such as gases or etchant, the etch conditions such as temperature, concentration, pressure or power, and the substrate surface preparation prior to the coating of the bottom resist layer 610 and may be determined by those of ordinary skill in the art given the teaching of the invention. Organic resist materials such as photoresists, PMMA or PMGI generally do not adhere well to the underlying material such as semiconductor or metal.

Figure 7A:
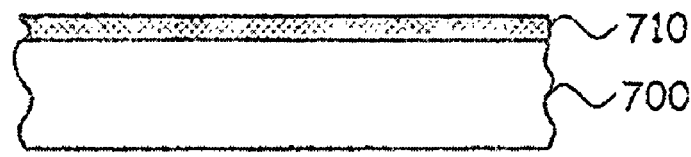
FIGS. 7a-7l are side cross-sectional schematic views showing progressive stages of methods of the present invention according to another embodiment.

In another exemplary embodiment of the present invention, a suitable dielectric layer 710 such as silicon nitride is first deposited on the substrate 700 by standard deposition techniques such as plasma enhanced chemical vapor deposition (PECVD). This is illustrated in FIG. 7a. Dielectric layer 710 such as silicon nitride is known to give good adhesion to semiconductor surface, and can be anisotropically etched by dry etching such as RIE or isotropically etched by wet etching. Dielectric layer 710 does not need to be thick as its primary purpose is to provide an interface with good adhesion between the dielectric layer 710 and the underlying substrate 700 so as to minimize the subsequent etch undercuts when the substrate material 700 is etched. The dielectric layer 710 can be as thin as 100 angstroms. The dielectric layer can also serve as a passivation layer to protect the underlying substrate surface in certain applications.

To minimize the etch undercuts around the exposed portion of the underlying substrate material 700 and to facilitate subsequent clean metal liftoff, the process flow shown in FIGS. 6a to 6j in the first exemplary embodiment of the present invention is modified to accommodate for the presence of this dielectric layer 710. The modified process flow in the second exemplary embodiment of the present invention is shown in FIGS. 7a to 7l.

Figure 7B:
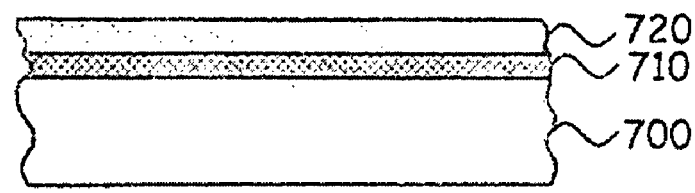
Figure 7C:
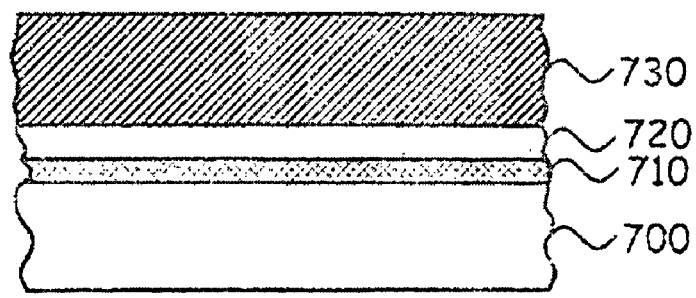
Figure 7D:
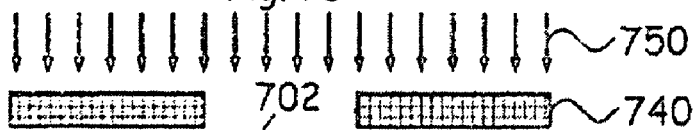
Figure 7E:
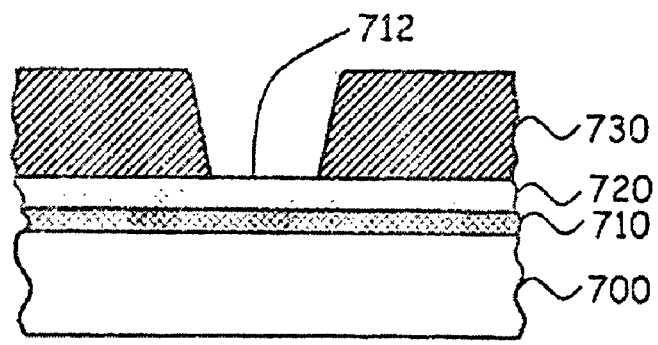
Figure 7F:
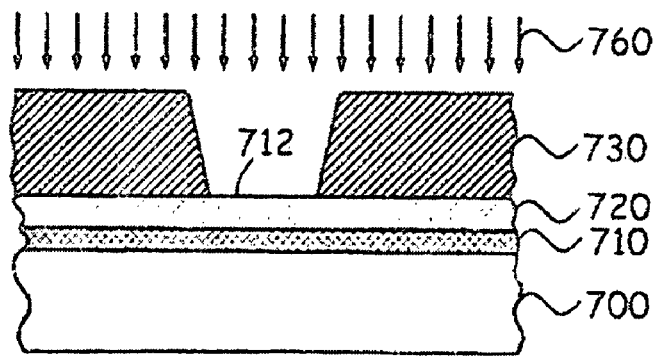
Figure 7G:
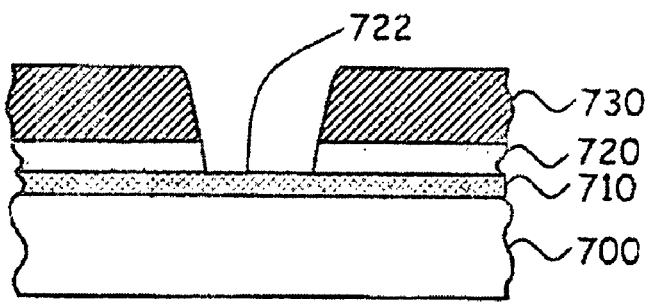
Figure 7H:
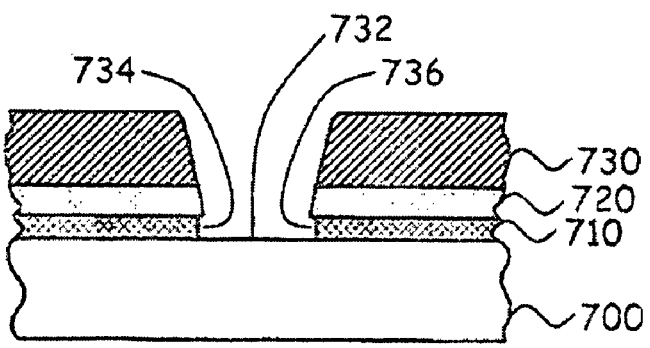
Figure 7I:
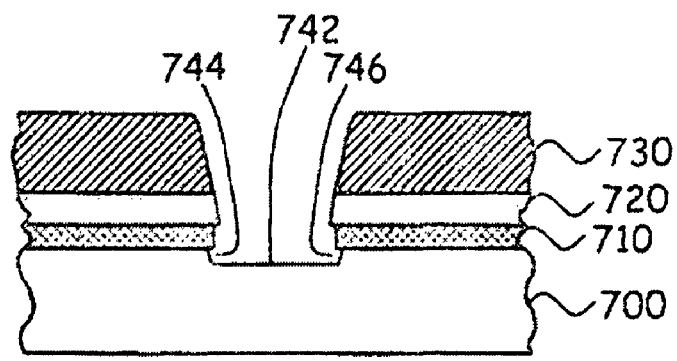

Following deposition of dielectric layer 710 on the substrate 700 shown in FIG. 7a, a relatively thin, bottom layer of resist 720 such as polymethyl-methacrylate (PMMA) is then formed (such as by coating) as shown in FIG. 7b on the dielectric layer 710 and baked. The bottom resist layer 720 is sensitive to deep UV light. A relatively thick, top layer of photoresist 730 such as AZ 9245 or Shipley SC1827 positive photoresist is subsequently spun on the bottom layer of resist 720 as shown in FIG. 7c and baked. The top photoresist is sensitive to near UV or violet light. Standard optical lithography tool such as a g-line or i-line stepper or a mask aligner is then used to expose a selected region 702 of the top layer photoresist 730 through an imaging mask 740 with near UV or violet irradiation 750 as illustrated in FIG. 7d. A first developer such as Shipley CD-30 is then used to develop the exposed portion 702 of the top layer photoresist 730, thereby exposing portion 712 of the bottom resist layer 720 in the top photoresist opening as illustrated in FIG. 7e. The bottom resist 720 is insensitive to the near UV or violet light and is unaffected with the first developer. As shown in FIG. 7f, the lithographically defined pattern in the top layer photoresist 730 is then transferred to the bottom resist layer 720 by removing the exposed resist portion 712 using highly anisotropic dry etching in oxygen plasma such as oxygen reactive ion etching (RIE) 760 using the patterned top layer photoresist 730 as the etch mask. This exposes portion 722 of the dielectric layer 710 as shown in FIG. 7g. The top layer photoresist 730 is thicker than the bottom layer resist 720 and does not completely erode before the exposed portion 712 of the bottom resist 720 is completely removed. Pattern defined this way in the bottom layer resist retains the steep vertical sidewalls of the top photoresist opening and has no bottom resist undercut around the bilayer resist opening as illustrated in FIG. 7g. It is important to minimize and preferably to have no bottom resist undercut in the resist patterning process so as to minimize the subsequent etch undercuts of the exposed portion of the underlying dielectric layer 710 relative to the edges of the top photoresist opening particularly when an isotropic etching method such as wet etching is used to remove the exposed dielectric layer. The exposed portion 722 of the dielectric material 710 is then removed by dry or wet etching to expose portion 732 of the underlying substrate 700 as shown in FIG. 7h. Depending on the etching method used, small etch undercuts 734 and 736 may be formed during the dielectric etching. The exposed portion 732 of the underlying substrate 700 is subsequently etched using this patterned bilayer resist and dielectric stack as the etch mask to an etched surface 742 of a desired etch depth, creating etch undercut regions 744 and 746 shown in FIG. 7i. Owing to the good adhesion between the dielectric layer 710 and the underlying substrate 700, the etch undercuts 744 and 746 are smaller than the corresponding etch undercut regions 634 and 636 illustrated in FIG. 6g in the first exemplary embodiment of the present invention.

Figure 7J:
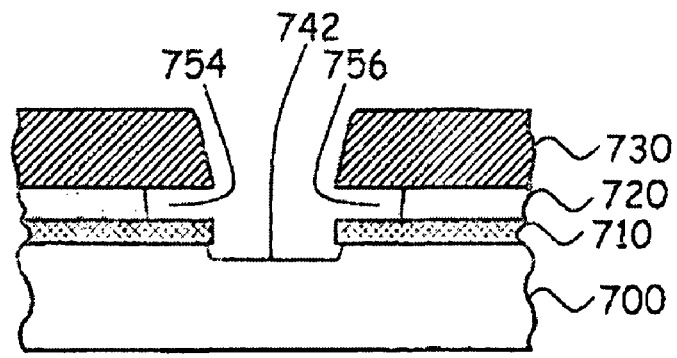
Figure 7K:
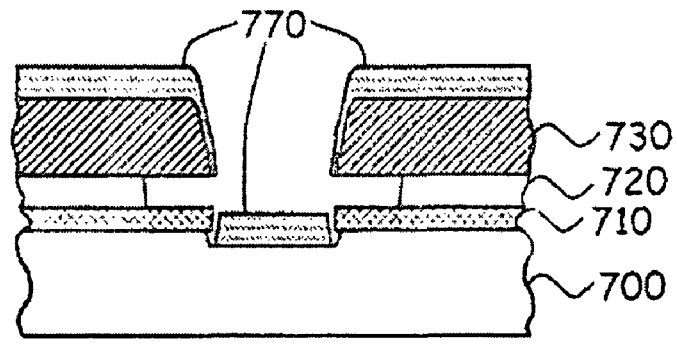
Figure 7L:
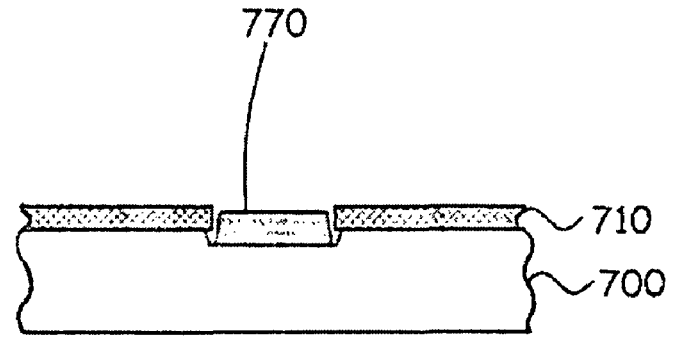

Subsequent creation of the resist overhang structure for facilitating clean metal liftoff follows a procedure similar to that described above in the first embodiment of the present invention. After the etching of the exposed portion 732 of the substrate 700, the entire wafer with the bilayer resist pattern is then blanket exposed without a mask with deep UV irradiation. This exposes the sidewalls of the bottom resist opening to the deep UV light. The sidewalls of the bottom resist opening are next developed in a second developer, which does not dissolve the exposed top layer photoresist 730. If the bottom resist 720 is PMMA and is etched earlier by the means of oxygen RIE, it may not be necessary to use the blanket exposure with deep UV irradiation to expose the sidewalls of the PMMA because the light emission from the oxygen plasma contains light of wavelengths that can expose the PMMA. One such second developer that develops exposed PMMA but not the top photoresist is toluene. The exposure of the sidewalls of the bottom resist opening to deep UV light and the subsequent bottom resist development result in an overhang resist edge profile as shown in FIG. 7j with bottom resist undercuts 754 and 756. The bottom resist undercut amount is determined by the development time in the second developer. Since the bottom resist layer 720 now serves only as a release layer to facilitate clean metal liftoff, huge bottom resist undercuts 754 and 756 can be made and used without the concern of transferring the resist undercut pattern to the underlying dielectric layer 710 and the substrate 700 as long as the top photoresist 730 does not get lifted off during the bottom resist development. Following the creation of an overhang resist edge profile in the bilayer resist structure, a metal evaporation or sputter deposition step is next performed to deposit the desired metal 770 on the wafer. The total deposited metal thickness is to be no greater than the combined etch depth of the underlying substrate, the thickness of the dielectric layer 710 and the thickness of the bottom resist layer 720 for clean metal liftoff so that the deposited metal 770 on the etched substrate surface 742 is not too thick to touch and connect to the deposited metal on the sidewalls of the top photoresist in the opening (FIG. 7k). Upon dissolving the two layers of resist in a suitable solvent such as acetone, the deposited metal 770 on top of the top layer photoresist 730 is lifted off, leaving only the patterned dielectric layer 710 and the deposited metal 770 on top of the etched substrate surface 742. The finished structure is shown in FIG. 7l.

The second exemplary embodiment of the present invention provides a method of further minimizing the etch undercuts 744 and 746 of the substrate material 700 relative to the edges of the deposited metal 770 on the etched substrate surface 742 when compared to the corresponding etch undercut regions 634 and 636 in the first embodiment of the present invention. The patterned dielectric layer 710 can be either left on the finished structure as a passivation layer to protect the unexposed portion of the underlying substrate or removed from the finished structure by dry or wet etching. In the former case, the patterned dielectric layer 710 and the deposited metal 770 together protect everywhere of the substrate surface except for the etch undercut regions 744 and 746 around the deposited metal pattern 770 on the etched substrate surface 742. The etch undercut regions 744 and 746 are exposed to outside environment through the little gaps between the edges of the dielectric opening and the edges of the deposited metal 770 as shown in FIG. 7l. This exposure to outside environment could result in unintentional chemical attack to these exposed etch undercut regions 744 and 746 in subsequent wafer processing if the regions are not protected by a separate passivation layer.

In another aspect, the present invention provides a method of scaling gaps that may be formed or are left behind during processing. The method is generally illustrated with reference to FIGS. 8a to 8m.

Figure 8A:
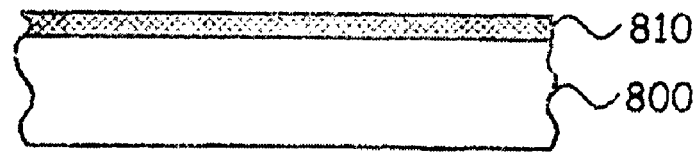
FIGS. 8a-8m depict side cross-sectional schematic views showing progressive stages of methods of the present invention according to other embodiments.
Figure 8B:
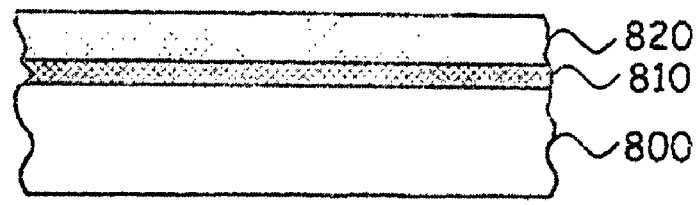
Figure 8C:
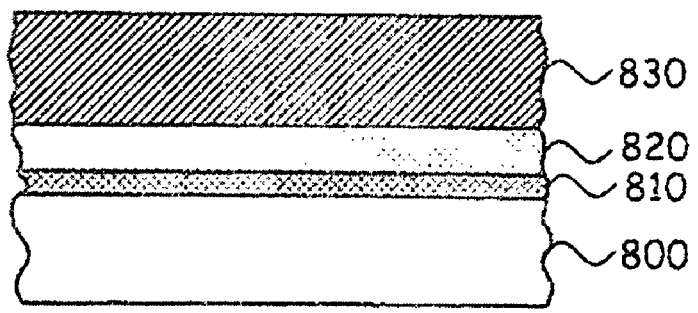
Figure 8D:
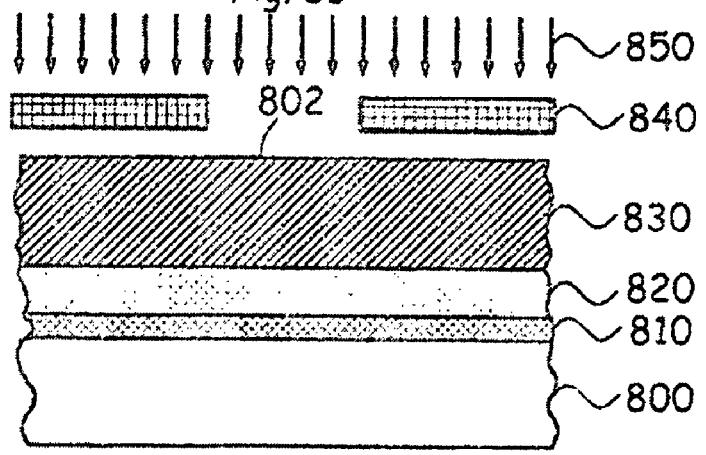
Figure 8E:
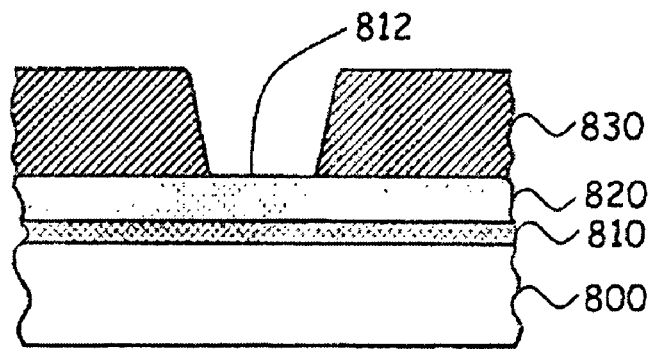
Figure 8F:
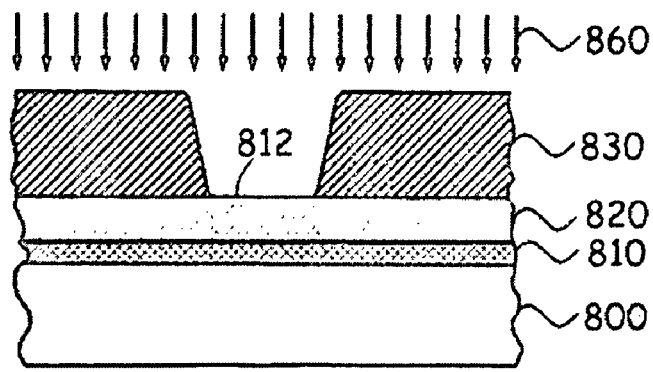
Figure 8G:
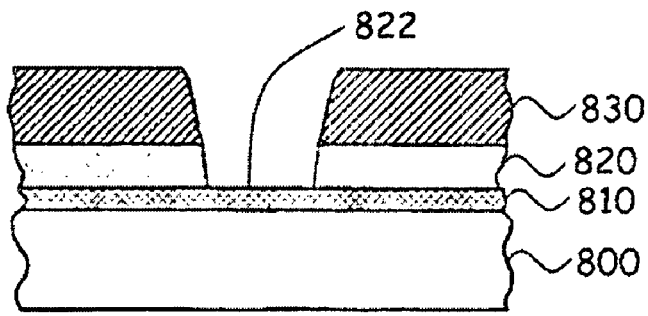
Figure 8H:
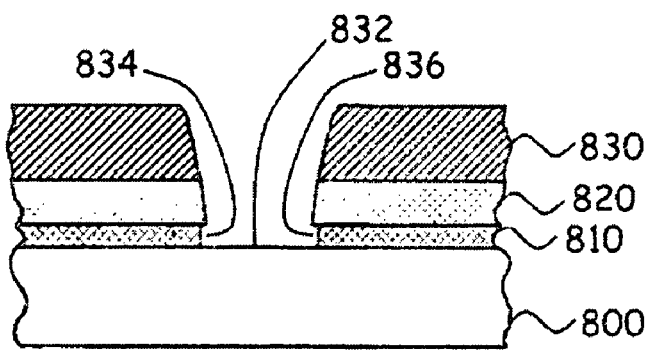

A suitable dielectric layer 810 such as silicon nitride is first deposited on the substrate 800 by standard deposition techniques such as plasma enhanced chemical vapor deposition (PECVD) as shown in FIG. 8a. A relatively thin, bottom layer of resist 820 such as polymethyl-methacrylate (PMMA) is then coated as shown in FIG. 8b on the dielectric layer 810 and baked. The thickness of the bottom resist layer 820 is to be larger than the intended total metal thickness, which in turn is to be larger than the combined etch depth of the underlying substrate and the thickness of the dielectric layer 810. The bottom resist 820 is sensitive to deep UV light. A relatively thick, top layer of photoresist 830 such as AZ 9245 or Shipley SC1827 positive photoresist is subsequently spun on the bottom layer of resist 820 as shown in FIG. 8*c* and baked. The top photoresist is sensitive to near UV or violet light. Standard optical lithography tool such as a g-line or i-line stepper or a mask aligner is then used to expose a selected region 802 of the top layer photoresist 830 through an imaging mask 840 with near UV or violet irradiation 850. This is shown in FIG. 8*d*. A first developer such as Shipley CD-30 is then used to develop the exposed portion 802 of the top layer photoresist 830, thereby exposing portion 812 of the bottom resist layer 820 in the top photoresist opening (FIG. 8*e*). The bottom resist 820 is insensitive to the near UV or violet light and is unaffected with the first developer. As shown in FIG. 8*f*, the lithographically defined pattern in the top layer photoresist 830 is then transferred to the bottom resist layer 820 by removing the exposed resist portion 812 using highly anisotropic dry etching such as oxygen reactive ion etching (RIE) 860 using the patterned top layer photoresist 830 as the etch mask. This exposes portion 822 of the dielectric layer 810 as shown in FIG. 8*g*. The top layer photoresist 830 is thicker than the bottom layer resist 820 and does not completely erode before the exposed portion 812 of the bottom resist 820 is completely removed. Pattern defined this way in the bottom layer resist retains the steep vertical sidewalls of the top photoresist opening and has no bottom resist undercut around the bilayer resist opening as illustrated in FIG. 8*g*. It is important to have no bottom resist undercut in the resist patterning process so as to minimize the subsequent etch undercuts of the exposed portion of the underlying dielectric layer 810 relative to the edges of the top photoresist opening particularly when an isotropic etching method such as wet etching is used to remove the exposed dielectric layer. The exposed portion 822 of the dielectric material 810 is then removed by dry or wet etching to expose portion 832 of the underlying substrate 800 as shown in FIG. 8*h*. Depending on the etching method used, small etch undercuts 834 and 836 may be formed during the dielectric etching.

Figure 8I:
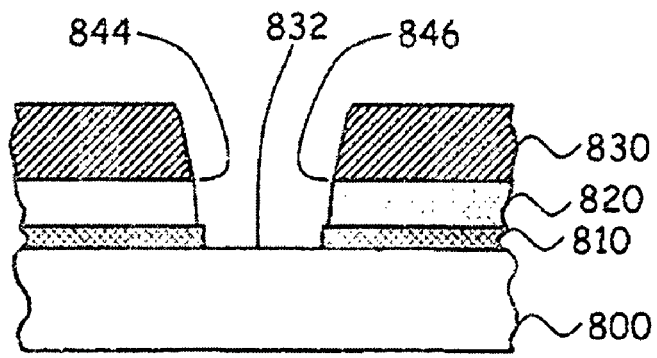

In a step different from the above described embodiments, the bilayer resist opening is next widened prior to the etching of the exposed portion 832 of the substrate 800. This is accomplished through the addition of a plasma etching step such as oxygen RIE or descum which etches some of the top photoresist layer 830 and the sidewalls 844 and 846 of the bilayer resist opening until the top photoresist opening is bigger than the dielectric opening as shown in FIG. 8*i*. Widening the bilayer resist opening prior to the etching of the exposed portion 832 of the substrate 800 is preferred because any surface damage associated with the oxygen plasma to the exposed portion 832 of the substrate 800 is subsequently removed when the exposed substrate surface 832 is etched.

Figure 8J:
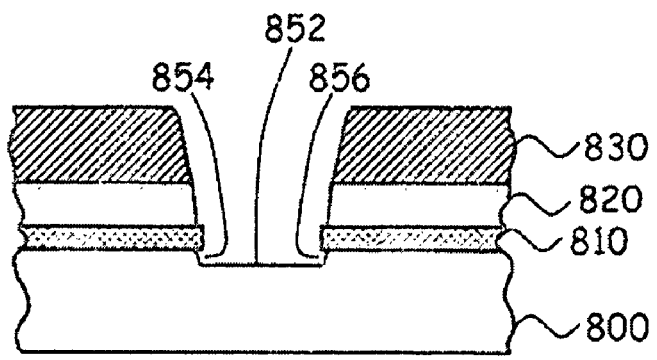

The exposed portion 832 of the underlying substrate 800 is then etched using this patterned bilayer resist and dielectric stack as the etch mask to an etched surface 852 of a desired etch depth, creating etch undercut regions 854 and 856 shown in FIG. 8*j*. Owing to the good adhesion between the dielectric layer 810 and the underlying substrate 800, the etch undercuts 854 and 856 are smaller than the corresponding etch undercut regions 634 and 636 illustrated in FIG. 6*g* in the first preferred embodiment of the present invention.

Figure 8K:
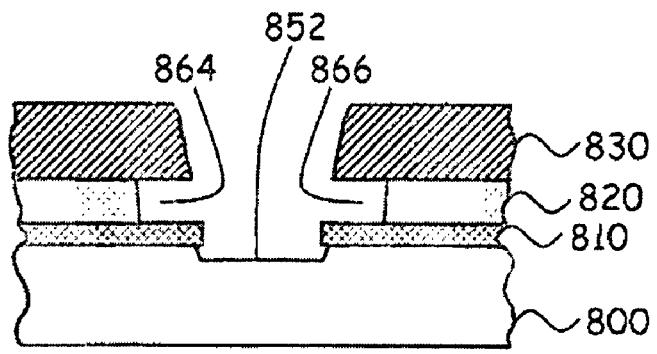

Subsequent creation of the resist overhang structure for facilitating clean metal liftoff follows a procedure similar to that described above in the first and second embodiments of the present invention. After the etching of the exposed portion 832 of the substrate 800, the entire wafer with the bilayer resist pattern is then blanket exposed without a mask with deep UV irradiation. This exposes the sidewalls of the bottom resist opening to the deep UV light. The sidewalls of the bottom resist opening are next developed in a second developer, which does not dissolve the exposed top layer photoresist 830. If the bottom resist 820 is PMMA and is etched earlier by the means of oxygen RIE, it may not be necessary to use the blanket exposure with deep UV irradiation to expose the sidewalls of the PMMA because the light emission from the oxygen plasma contains light of wavelengths that can expose the PMMA. One such second developer that develops exposed PMMA but not the top photoresist is toluene. The exposure of the sidewalls of the bottom resist opening to deep UV light and the subsequent resist development result in an overhang resist edge profile as shown in FIG. 8*k* with bottom resist undercuts 864 and 866. The bottom resist undercut amount is determined by the development time in the second developer. Since the bottom resist layer 820 now serves only as a release layer to facilitate clean metal liftoff, huge bottom resist undercuts 864 and 866 can be made and used without the concern of transferring the resist undercut pattern to the underlying dielectric layer 810 and the substrate 800 as long as the top resist 830 does not get lifted off during the bottom resist development.

Figure 8L:
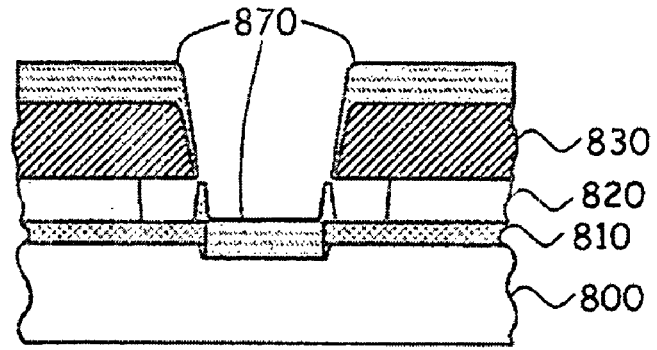
Figure 8M:
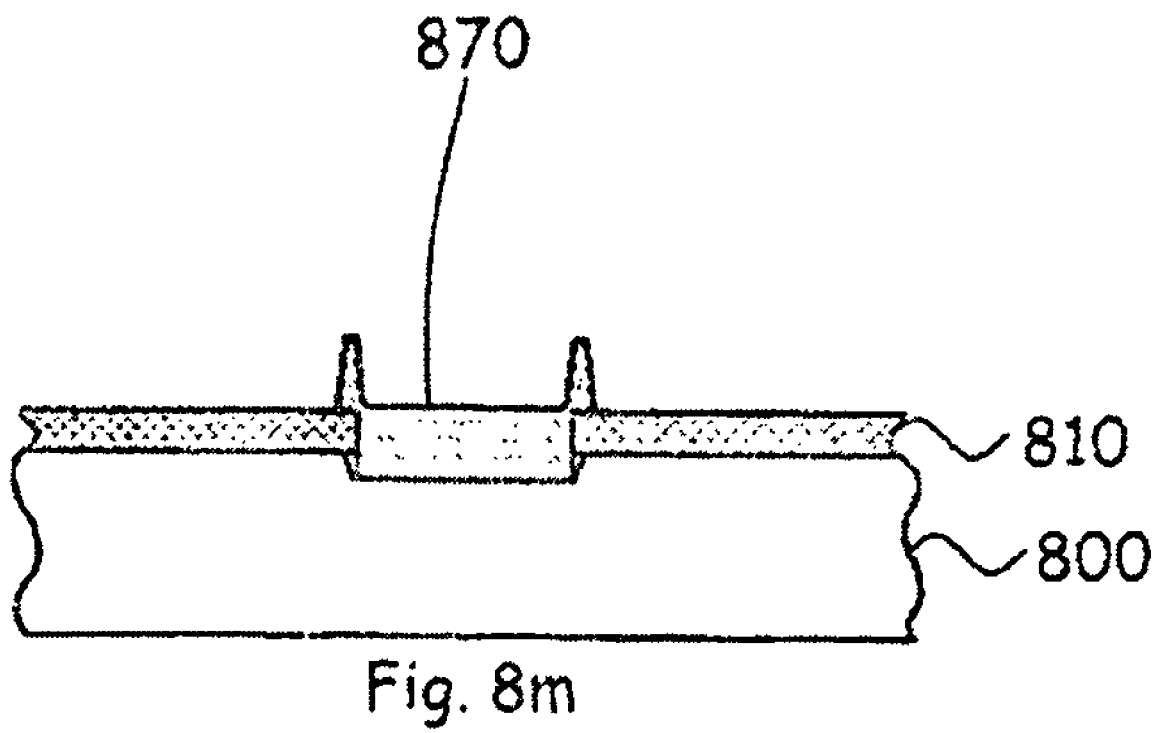

Following creation of an overhang resist edge profile in the bilayer resist structure, a metal evaporation or sputter deposition step is next performed to deposit the desired metal 870 on the wafer as illustrated in FIG. 8*l*. The total deposited metal thickness is to be larger than the combined etch depth of the underlying substrate and the thickness of the dielectric layer 810, but is to be smaller than the thickness of the bottom resist layer 820 for clean metal liftoff. Because the top photoresist opening is larger than the dielectric opening after going through the earlier pattern widening step of the resist opening and because the bottom resist has undercuts 864 and 866, metal is also deposited on top of the exposed portions of the dielectric layer around the dielectric opening. When the total thickness of the deposited metal 870 is larger than the combined etch depth of the substrate material and the thickness of the dielectric layer 810, the deposited metal 870 on the etched substrate surface 852 and on the exposed portion of the dielectric layer around the dielectric opening will touch and connect to each other, thereby completely sealing the aforementioned gap in the second embodiment of the present invention and properly protecting the etch undercut regions 854 and 856 from outside environment. The deposited metal 870 is to be thinner than the bottom resist layer 820 so that the deposited metal 870 on top of the exposed portions of the dielectric layer around the dielectric opening is not too thick to touch and correct to the deposited metal on the sidewalls of the top photoresist in the opening as shown in FIG. 8*l*. Upon dissolving the two layers of resist in a suitable solvent such as acetone, the deposited metal 870 on top of the top layer photoresist 830 is lifted off, leaving only the patterned dielectric layer 810 and the deposited metal 870 on top of the etched substrate surface 852 and on top of the dielectric layer 810 around the dielectric opening. The finished structure is shown in FIG. 8*m*.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, though only oxygen plasma was mentioned above for removing the exposed portions of the bottom resist layers in the top photoresist openings in the above embodiments, it may be appreciated that other etching methods such as ion milling may be used. Also, though the substrates were shown as single layers in the drawings of the above embodiments, it may be appreciated that multi-layer substrate materials may be used. It is therefore intended that the appended claims encompass any such modifications or embodiments.

What is claimed is:

1. A method of etching a substrate to form one or more metallization features on the substrate, comprising:
    forming a bottom layer of resist on the substrate, said bottom layer of resist being sensitive to energy in a first selected range;
    forming a top layer of resist on said bottom layer, said top layer of resist being of a thickness greater than said bottom layer and being sensitive to energy in a second selected range;
    exposing a selected portion of the top layer of resist to the second selected range of energy and removing the exposed portion in the top layer to expose a portion of the bottom layer;
    removing the exposed portion of the bottom layer of resist to expose a portion of the substrate;
    etching the exposed portion of the substrate to a desired depth;
    forming resist undercuts in said bottom layer of resist subsequent to said etching of the exposed portion of the substrate;
    depositing metal on the exposed portion of the substrate and top layer of resist; and
    removing the top and bottom layers of resist and lifting off the metal formed on the top layer of resist to form one or more metallization features on the substrate.

2. The method of claim 1 wherein said removing the exposed portion in the top layer to expose a portion of the bottom layer is carried out by removal of the exposed portion in the top layer with a developer solution, wherein the developer solution does not dissolve the bottom layer of resist.

3. The method of claim 1 wherein said forming resist undercuts in said bottom layer of resist is carried out by developing a sidewall in said bottom layer of resist with a developer solution, wherein the developer solution does not dissolve the top layer of resist.

4. The method of claim 1 wherein said first selected range of energy comprises energy having a wavelength of equal to or less than about 310 nanometers.

5. The method of claim 1 wherein said second selected range of energy comprises energy having a wavelength of greater than about 310 nanometers.

6. The method of claim 1 wherein said bottom layer of resist is comprised of polymethyl-methacrylate (PMMA).

7. The method of claim 1 wherein said removing the exposed portion of the bottom layer of resist comprises removing the exposed portion of the bottom layer of resist using oxygen reactive ion etching utilizing the top layer of resist as an etch mask.

8. The method of claim 1 wherein said top layer of resist is formed atop a non-planar substrate.

9. The method of claim 1 further comprising: forming a layer of dielectric material on the substrate prior to forming the bottom layer of resist.

10. The method of claim 1 wherein said exposing said selected portion of said top layer is accomplished through use of an imaging mask.

11. The method of claim 1, wherein the deposition of said metal is accomplished by evaporation or sputter deposition.

12. A method comprising:
    forming a bilayer resist structure on a substrate;
    etching an exposed portion of the substrate to a desired etch depth;
    forming an overhang resist edge profile in a bottom layer of the bilayer resist structure after said etching of the exposed portion of the substrate;
    forming one or more metallization features on the substrate; and
    removing the bilayer resist structure subsequent to said forming of the one or more metallization features on the substrate.

13. A method of etching a substrate to form one or more metallization features on the substrate, comprising:
    forming a dielectric layer on the substrate;
    forming a bottom layer of resist on the dielectric layer, said bottom layer of resist being sensitive to energy in a first selected range;
    forming a top layer of resist on said bottom layer, said top layer of resist being of a thickness greater than said bottom layer and being sensitive to energy in a second selected range;
    exposing a selected portion of the top layer of resist to the second selected range of energy and removing the exposed portion in the top layer to expose a portion of the bottom layer;
    removing the exposed portion of the bottom layer of resist to expose a portion of the dielectric layer;
    removing the exposed portion of the dielectric layer using the top and bottom layers as an etch mask to expose a portion of the substrate;
    etching the exposed portion of the substrate to a desired depth;
    forming resist undercuts in said bottom layer of resist subsequent to said etching of the exposed portion of the substrate;
    depositing metal on the exposed portion of the substrate and top layer of resist; and
    removing the top and bottom layers of resist, and lifting off the metal formed on the top layer of resist to form one or more metallization features on the substrate.

14. The method of claim 13 wherein said removing the exposed portion in the top layer to expose a portion of the bottom layer is carried out by removal of the exposed portion in the top layer with a developer solution, wherein the developer solution does not dissolve the bottom layer of resist.

15. The method of claim 13 wherein said forming resist undercuts in said bottom layer of resist is carried out by developing a sidewall in said bottom layer of resist with a developer solution, wherein the developer solution does not dissolve the top layer of resist.

16. The method of claim 13 wherein said first selected range of energy comprises energy having a wavelength of equal to or less than about 310 nanometers, and the second selected range of energy comprises energy having a wavelength of greater than about 310 nanometers.

17. The method of claim 13 wherein said bottom layer of resist is comprised of polymethyl-methacrylate (PMMA).

18. The method of claim 13 wherein said forming resist undercuts in said bottom layer of resist is carried out by exposure of a sidewall in said bottom layer of resist to an oxygen plasma.

19. The method of claim 13 wherein said removing the exposed portion of the bottom layer of resist comprises removing the exposed portion of the bottom layer of resist using oxygen reactive ion etching utilizing the top layer of resist as an etch mask.

20. The method of claim 13 wherein said exposing the selected portion of said top layer is accomplished through use of an imaging mask.

21. The method of claim 13 wherein said dielectric layer has a thickness equal to or greater than 100 angstroms.

22. The method of claim 13 wherein said dielectric layer is comprised of silicon nitride.

23. The method of claim 13 further comprising:
widening the opening in the top and bottom resist layers prior to etching the exposed portion of the substrate and metal deposition, wherein the opening in the top and bottom resist layers is larger than the opening in the dielectric layer.

24. The method of claim 23 wherein said depositing metal further comprises depositing metal on exposed portions of the dielectric layer to form a sealed region around the one or more metallization regions.

25. The method of claim 13, further comprising:
removing the dielectric layer after the removing of the top and bottom layers of the resist.

26. A method of fabricating a metalized etched pattern on a substrate, comprising:
forming a dielectric layer directly on said substrate;
forming a bottom layer of resist material directly on said dielectric layer, said resist material of said bottom layer being sensitive to a first predetermined spectrum of light, the thickness of said bottom layer being larger than the combined desired etch depth of said substrate and the thickness of said dielectric layer;
forming a top layer of photoresist material directly on said bottom layer, said top layer being thicker than said bottom layer, said photoresist material of said top layer being sensitive to a second predetermined spectrum of light, wherein said first predetermined spectrum is of a wavelength shorter than said second predetermined spectrum;
exposing a selected portion of said top layer to light of said second predetermined spectrum;
removing the exposed portion of said top layer in a first developer to expose portion of said bottom layer, said first developer does not dissolve said bottom layer exposed to light of said second predetermined spectrum;
removing said exposed portion of said bottom layer using said top layer as the etch mask to expose portion of said dielectric layer;
removing said exposed portion of said dielectric layer using said top and bottom layers as the etch mask to expose portion of said substrate;
etching the exposed portions of sidewalls of the opening in said top and bottom layers until the size of said opening in said top layer is larger than the size of opening in said dielectric layer;
etching said exposed portion of said substrate to said desired etch depth;
exposing the sidewalls of the opening in said bottom layer to light of said first predetermined spectrum;
forming resist undercuts in said bottom layer by subjecting said exposed sidewalls of the opening in said bottom layer to a second developer, said second developer does not develop said photoresist material of said top layer;
depositing metal, said metal of total thickness being larger than the combined said etch depth of said substrate and the thickness of said dielectric layer but less than the thickness of said bottom layer; and
dissolving said top and bottom layers in solvent and lifting off said metal on said top layer.

27. The method of claim 26, wherein the removing said exposed portion of said bottom layer comprises:
etching the bottom layer with oxygen plasma,
wherein the etching the bottom layer with oxygen plasma provides said exposing the sidewalls of the opening in said bottom layer to light of said first predetermined spectrum.

28. The method of claim 26, wherein the exposing the sidewalls of the opening in said bottom layer to light of said first predetermined spectrum comprises:
exposing, after the etching said exposed portion of said substrate to said desired etch depth, the sidewalls of the opening in said bottom layer to a blanket exposure of light of said first predetermined spectrum.

* * * * *